United States Patent
Choi et al.

(10) Patent No.: US 9,250,520 B2
(45) Date of Patent: Feb. 2, 2016

(54) BLACK PHOTOSENSITIVE RESIN COMPOSITION AND LIGHT BLOCKING LAYER USING THE SAME

(71) Applicant: Cheil Industries Inc., Gumi-si (KR)

(72) Inventors: Hyun-Moo Choi, Uiwang-si (KR); Arum Yu, Uiwang-si (KR); Ho-Jeong Paek, Uiwang-si (KR); Chang-Min Lee, Uiwang-si (KR); Seung-Jib Choi, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/279,402

(22) Filed: May 16, 2014

(65) Prior Publication Data

US 2015/0147700 A1    May 28, 2015

(30) Foreign Application Priority Data

Nov. 27, 2013  (KR) .................. 10-2013-0145454

(51) Int. Cl.
| | | |
|---|---|---|
| *G03F 7/032* | (2006.01) | |
| *G03F 7/038* | (2006.01) | |
| *G03F 7/075* | (2006.01) | |
| *G03F 7/00* | (2006.01) | |
| *G02B 5/22* | (2006.01) | |

(52) U.S. Cl.
CPC .............. *G03F 7/0384* (2013.01); *G02B 5/223* (2013.01); *G03F 7/0007* (2013.01); *G03F 7/032* (2013.01); *G03F 7/0752* (2013.01)

(58) Field of Classification Search
CPC ... G02F 1/133512; G02B 5/223; G03F 7/007; G03F 7/027; G03F 7/028; G03F 7/032; G03F 7/004
USPC .................. 430/7, 270.1, 281.1; 359/110
See application file for complete search history.

(56) References Cited

U.S. PATENT DOCUMENTS

| | | |
|---|---|---|
| 7,749,682 B2 | 7/2010 | Miyabe et al. |
| 9,063,412 B2 | 6/2015 | Liao et al. |
| 2003/0113640 A1 | 6/2003 | Sabnis et al. |
| 2012/0196980 A1 | 8/2012 | Kliesch et al. |

FOREIGN PATENT DOCUMENTS

| | | | |
|---|---|---|---|
| EP | 2482338 A2 | | 8/2012 |
| JP | 2002-285007 A | * | 10/2002 |
| JP | 2007-322485 A | | 12/2007 |
| JP | 2008-304583 A | * | 12/2008 |
| JP | 2011-075691 A | | 4/2011 |
| JP | 5117714 B2 | | 1/2013 |
| JP | 2013-054393 A | | 3/2013 |
| KR | 10-2008-0107298 A | | 12/2008 |
| KR | 10-2012-0043416 A | | 5/2012 |
| KR | 10-1167011 B1 | | 7/2012 |
| KR | 10-2013-0021139 A | | 3/2013 |
| TW | 201337345 A | | 9/2013 |

OTHER PUBLICATIONS

Computer-generated translation of JP 2002-285007 (Oct. 2002).*
Computer-generated translation of JP 2008-304583 (Dec. 2008).*
Computer-generated translation of KR 10-2012-0043416 (May 2012).*

* cited by examiner

*Primary Examiner* — John A McPherson
(74) *Attorney, Agent, or Firm* — Additon, Higgins & Pendleton, P.A.

(57) ABSTRACT

Disclosed are a black photosensitive resin composition including (A) a binder resin; (B) a colorant including a pigment and a silica nanoparticle; (C) a photopolymerizable compound; (D) a photopolymerization initiator; and (E) a solvent, wherein the silica nanoparticle is included in an amount of about 1 part by weight to about 11 parts by weight based on about 100 parts by weight of the pigment, and a light blocking layer and a color filter using the same.

13 Claims, 4 Drawing Sheets

Comparative Example 1          Comparative Example 2

Example 1　　　　　　　　Example 3　　　　　　　　Example 5

BLACK PHOTOSENSITIVE RESIN COMPOSITION AND LIGHT BLOCKING LAYER USING THE SAME

CROSS-REFERENCE TO RELATED APPLICATION

This application claims priority to and the benefit of Korean Patent Application No. 10-2013-0145454 filed in the Korean Intellectual Property Office on Nov. 27, 2013, the entire disclosure of which is incorporated herein by reference.

FIELD OF THE INVENTION

This disclosure relates to a black photosensitive resin composition, and a light blocking layer and a color filter prepared using the black photosensitive resin composition.

BACKGROUND OF THE INVENTION

A liquid crystal display device includes a lower substrate including a color filter including a light blocking layer, a lower substrate on which an ITO pixel electrode is formed; an active circuit portion including a liquid crystal layer, a thin film transistor, and a capacitor layer; and an upper substrate on which an ITO pixel electrode is formed.

The light blocking layer blocks uncontrolled light transmitted out of a transparent pixel electrode of a substrate and thus prevents contrast reduction due to light transmitted through a thin film transistor. Red, green, and blue color layers transmit light with a predetermined wavelength of white light and display colors.

The light blocking layer is generally manufactured by a pigment dispersion method. The pigment dispersion method includes coating a transparent substrate with a colorant-containing photopolymerizable composition, exposing to provide a pattern by thermal curing, and removing non-exposed portions with a solvent.

However, when a photosensitive polyimide or phenol-based resin is used as a binder resin in the pigment dispersion method, high heat resistance may be obtained but sensitivity can be lowered and an organic solvent is required as a development solvent. A photoresist using an azide compound can have low sensitivity and heat resistance and may be affected by oxygen during exposure.

There have been attempts to improve taper characteristics by increasing the amount of a pigment in a photosensitive resin composition. There have also are been attempts to increase glass transition temperature by using a binder resin having a large molecular weight, a dispersing agent, or the like. These efforts, however, can result in deteriorating resolution or a development margin.

Accordingly, there is a need for a photosensitive resin composition that can have excellent pattern linearity, resolution, and the like as well as improved taper characteristics.

SUMMARY OF THE INVENTION

One embodiment provides a black photosensitive resin composition that can have excellent resolution, linearity and/or taper characteristics.

Another embodiment provides a light blocking layer manufactured prepared using the black photosensitive resin composition.

Yet another embodiment provides a color filter manufactured prepared using the black photosensitive resin composition.

One embodiment provides a black photosensitive resin composition that includes (A) binder resin; (B) a colorant including a pigment and a silica nanoparticle; (C) a photopolymerizable compound; (D) a photopolymerization initiator; and (E) a solvent, wherein the silica nanoparticle is included in an amount of about 1 part by weight to about 11 parts by weight based on about 100 parts by weight of the pigment.

The silica nanoparticle may be included in an amount of about 1 part by weight to about 5 parts by weight based on about 100 parts by weight of the pigment.

The silica nanoparticle may have an average particle diameter of about 10 nm to about 50 nm.

The silica nanoparticle may have an average particle diameter of about 10 nm to about 20 nm.

The pigment included in the colorant may be a black pigment.

The black pigment may be carbon black.

The binder resin may be a cardo-based resin.

The black photosensitive resin composition may include about 1 wt % to about 30 wt % of the binder resin (A); about 1 wt % to about 30 wt % of the colorant (B) including pigment and silica nanoparticle; about 1 wt % to about 20 wt % of the photopolymerizable compound (C); about 0.05 wt % to about 5 wt % of the photopolymerization initiator (D); and a balance amount of the solvent (E).

The black photosensitive resin composition may further include an additive selected from malonic acid; 3-amino-1,2-propanediol; a silane-based coupling agent having a vinyl group or a (meth)acryloxy group; a leveling agent; a fluorine-based surfactant; a radical polymerization initiator; or a combination thereof.

The black photosensitive resin composition may have a taper angle of about 35° to about 70°.

Another embodiment provides a light blocking layer manufactured using the black photosensitive resin composition.

Yet another embodiment provides a color filter manufactured using the black photosensitive resin composition.

Other embodiments of the present invention are included in the following detailed description.

The black photosensitive resin composition can have excellent resolution, linearity, and/or taper characteristics and may be usefully applied as a light blocking layer and the like.

DETAILED DESCRIPTION

Figure 1:
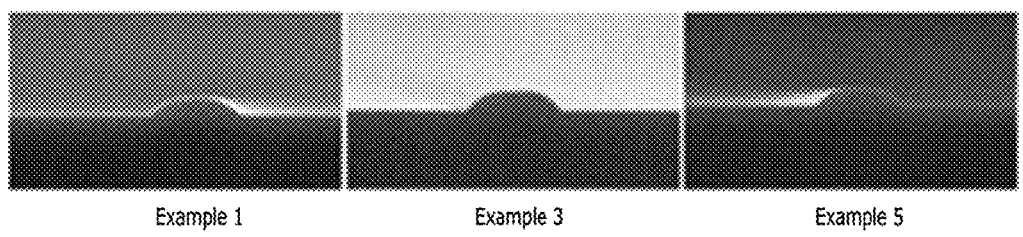
FIG. 1 includes scanning electron microscopy (SEM) photographs showing patterns obtained by curing the black photosensitive resin compositions according to Examples 1, 3, and 5.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term "alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20 aryl, the term "arylalkyl" refers to C7 to C20 arylalkyl, the term "alkylene" refers to C1 to C20 alkylene, the term "arylene" refers to C6 to C20 arylene, the term "alkylarylene" refers to C7 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "substituted" refers to one substituted with at least one substituent including halogen (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, instead of at least one hydrogen.

As used herein, when a specific definition is not otherwise provided, the term "hetero" refers to one including at least one heteroatom including N, O, S, and/or P in chemical formulae.

As used herein, when a specific definition is not otherwise provided, "(meth)acrylate" refers to both "acrylate" and "methacrylate," and "(meth)acrylic acid" refers to "acrylic acid" and "methacrylic acid."

As used herein, when a specific definition is not otherwise provided, the term "combination" refers to mixing or copolymerization.

As used herein, unless a specific definition is otherwise provided, a hydrogen atom is bonded at a position when a chemical bond is not drawn where a bond would otherwise appear.

As used herein, when a specific definition is not otherwise provided, the unsaturated bond may include a bond including other atoms such as a carbonyl bond, an azo bond, and the like as well as a multiple bonds between carbon-carbon atoms.

As used herein, the cardo-based resin refers to a resin including at least one or more repeat units selected from the following Chemical Formulae 1-1 to 1-11 in the backbone of the resin.

As used herein, when a specific definition is not otherwise provided, "*" indicates a point where the same or different atom or chemical formula is linked.

A black photosensitive resin composition according to one embodiment includes (A) a binder resin; (B) a colorant including a pigment and a silica nanoparticle; (C) a photopolymerizable compound; (D) a photopolymerization initiator; and (E) a solvent, wherein the silica nanoparticle is included in an amount of about 1 part by weight to about 11 parts by weight based on about 100 parts by weight of the pigment.

When the silica nanoparticle is included in the colorant in an amount within the above range, improved taper characteristics as well as excellent linearity and developability of a pattern obtained by coating the photosensitive resin composition on a substrate and then, developing and heat-treating it may be accomplished.

Hereinafter, each component is specifically described.

(B) Colorant

The colorant includes a silica nanoparticle along with a pigment, and the silica nanoparticle may be included in an amount of about 1 part by weight to about 11 parts by weight based on about 100 parts by weight of a pigment. For example, the silica nanoparticle may be included in an amount of about 1 part by weight to about 5 parts by weight based on about 100 parts by weight of the pigment. In some embodiments, the colorant may include the silica nanoparticle in an amount of about 1, 2, 3, 4, 5, 6, 7, 8, 9, 10, or 11 parts by weight. Further, according to some embodiments of the present invention, the amount of the silica nanoparticle can be in a range from about any of the foregoing amounts to about any other of the foregoing amounts.

When the colorant includes the silica nanoparticle, the silica nanoparticle may be dispersed in the pigment. When the silica nanoparticle is dispersed in the pigment, a taper angle may be easily adjusted depending on the amount of the silica nanoparticle, and accordingly, a light blocking layer having a taper angle of greater than or equal to about 35° and excellent resolution may be manufactured.

As aforementioned, when the silica nanoparticle is included in an amount within the above range, a taper angle can be in a range of about 35° to about 70°, for example, about 35° to about 50°, and pattern linearity and developability can be improved. On the other hand, when the silica nanoparticle is included in an amount of greater than about 11 parts by weight based on about 100 parts by weight of the pigment, a black photosensitive resin composition may generate a wrinkle in a photosensitive resin film obtained after post-baking the black photosensitive resin composition and increase surface roughness thereof, and thus, a taper angle can be difficult to adjust. In addition, when the silica nanoparticle is included in an amount of less than about 1 part by weight based on about 100 parts by weight of a pigment, a black photosensitive resin composition may hardly form a pattern due to sharply deteriorated melting characteristics during post-baking, and even if a pattern is formed, the pattern may have unsatisfactory linearity as well as deteriorated surface characteristics.

The silica nanoparticle may have an average particle diameter of about 10 nm to about 50 nm, for example about 10 nm to about 20 nm. In some embodiments, the silica nanoparticle may have an average particle diameter of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 nm. Further, according to some embodiments of the present invention, the average particle diameter of the silica nanoparticle can be in a range from about any of the foregoing diameters to about any other of the foregoing diameters.

When the silica nanoparticle has an average particle diameter of less than about 10 nm, dispersion of the silica nanoparticle in a composition may be deteriorated. When the silica nanoparticle has an average particle diameter of greater than about 50 nm, surface roughness of a photosensitive resin film can increase, deteriorating taper characteristics.

The pigment included in the colorant may be a black pigment. Examples of the black pigment may include without limitation aniline black, perylene black, titanium black, cyanine black, carbon black and the like, and combinations thereof. For example, the black pigment may be carbon black. When the pigment includes a black pigment, for example, carbon black, light blocking, surface flatness, dispersion stability, and/or compatibility with a binder resin can be excellent.

The black pigment may also be used with a color calibrator. Examples of the color calibrator may include without limitation anthraquinone-based pigments, perylene-based pigments, phthalocyanine-based pigments, azo-based pigments, and the like, and combinations thereof.

The pigment may include a red pigment, a green pigment, a blue pigment, a yellow pigment, or a combination thereof in addition to the black pigment.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may include without limitation halogen-substituted copper phthalocyanine pigments such as C.I. green pigment 36, C.I. green pigment 7, and the like. Examples of the blue pigment may include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment may include without limitation isoindoline-based pigments such as C.I. yellow pigment 139, and the like, quinophthalone-based pigments such as C.I. yellow pigment 138, and the like, nickel complex pigments such as C.I. yellow pigment 150, and the like. The pigment may be used singularly or as a mixture of two or more, but is not limited thereto.

The black photosensitive resin composition may further include a dispersing agent in order to improve dispersion of the pigment. For example, the pigment may be surface-pre-treated with a dispersing agent, or the pigment and dispersing agent may be added together during preparation of the black photosensitive resin composition.

The dispersing agent may be a non-ionic dispersing agent, an anionic dispersing agent, a cationic dispersing agent, and the like. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; and/or PB711, PB821, and the like made by Ajinomoto Inc.

The dispersing agent may be included in an amount of about 0.1 wt % to about 15 wt % based on the total weight (100 wt %) of the black photosensitive resin composition. When the dispersing agent is included in an amount within the above range, the black photosensitive resin composition can have excellent dispersion property and thus, may form a light blocking layer that can have excellent stability, developability, and/or pattern-forming capability.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then, filtering and washing the kneaded pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like, and combinations thereof. The wetting agent may allow the pigment to be uniformly mixed with the water-soluble inorganic salt and be pulverized. Examples of the wetting agent may include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter ranging from about 30 nm to about 100 nm. In some embodiments, the pigment after kneading may have an average particle diameter of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 nm. Further, according to some embodiments of the present invention, the average particle diameter of the pigment after the kneading can be in a range from about any of the foregoing diameters to about any other of the foregoing diameters.

When the pigment has an average particle diameter within the above range, a fine pattern having excellent heat resistance and/or light resistance may be effectively formed.

The black photosensitive resin composition may include the colorant in an amount of about 1 wt % to about 30 wt %, for example about 2 wt % to about 20 wt %, based on the total amount (total weight, 100 wt %) of black photosensitive resin composition. In some embodiments, the black photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the colorant can be in a range from about any of the foregoing amounts to about any other of the foregoing amounts.

When the pigment is included in an amount within the above range, a pattern having excellent color reproducibility, curing property, and/or close contacting (adhesive) property may be obtained.

(A) Binder Resin

The binder resin may include a cardo-based resin. When the binder resin is a cardo-based resin, a black photosensitive resin composition including the cardo-based resin may have excellent developability and/or excellent pattern-forming capability due to excellent sensitivity during a curing process.

The binder resin may be represented by the following Chemical Formula 1.

[Chemical Formula 1]

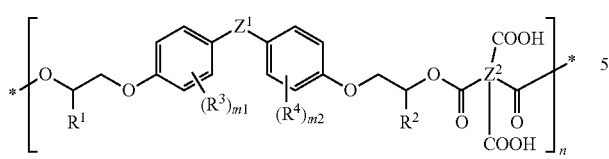

In the above Chemical Formula 1, $R^1$ and $R^2$ are the same or different and are each independently hydrogen or a substituted or unsubstituted (meth)acryloyloxy alkyl group, $R^3$ and $R^4$ are the same or different and are each independently hydrogen, halogen, or substituted or unsubstituted C1 to C20 alkyl, each $Z^1$ is independently a single bond, O, CO, $SO_2$, $CR^7R^8$, $SiR^9R^{10}$ (wherein $R^7$ to $R^{10}$ are the same or different and are each independently hydrogen or substituted or unsubstituted C1 to C20 alkyl), or one of linking groups represented by the following Chemical Formulae 1-1 to 1-11,

[Chemical Formula 1-1]

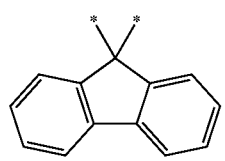

[Chemical Formula 1-2]

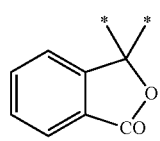

[Chemical Formula 1-3]

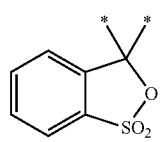

[Chemical Formula 1-4]

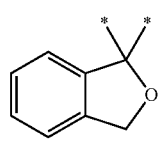

[Chemical Formula 1-5]

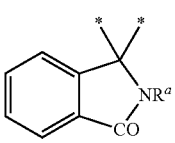

In the above Chemical Formula 1-5, $R^a$ is hydrogen, ethyl, $C_2H_4Cl$, $C_2H_4OH$, $CH_2CH=CH_2$, or phenyl.

[Chemical Formula 1-6]

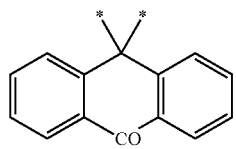

[Chemical Formula 1-7]

[Chemical Formula 1-8]

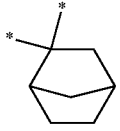

[Chemical Formula 1-9]

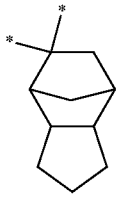

[Chemical Formula 1-10]

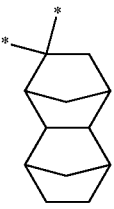

[Chemical Formula 1-11]

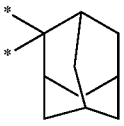

each $Z^2$ is independently an acid anhydride residual group or an acid dianhydride residual group, m1 and m2 are the same or different and are each independently integers ranging from 0 to 4, and n is an integer ranging from 1 to 30.

The binder resin may have a weight average molecular weight of about 500 g/mol to about 50,000 g/mol, for example about 1,000 g/mol to about 30,000 g/mol. When the binder resin has a weight average molecular weight within the above range, a pattern may be well formed with minimal or no residue during manufacture of a light blocking layer and/or with minimal or no loss of a film thickness during development.

The binder resin may include a functional group represented by the following Chemical Formula 2 at least one of both terminal ends.

[Chemical Formula 2]

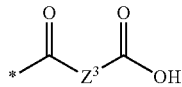

In the above Chemical Formula 2, $Z^3$ is represented by the following Chemical Formulae 2-1 to 2-7.

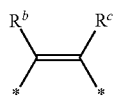
[Chemical Formula 2-1]

In the above Chemical Formula 2-1, $R^b$ and $R^c$ are the same or different and are each independently hydrogen, substituted or unsubstituted C1 to C20 alkyl, an ester group, or an ether group.

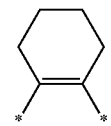
[Chemical Formula 2-2]

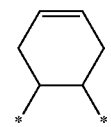
[Chemical Formula 2-3]

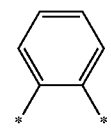
[Chemical Formula 2-4]

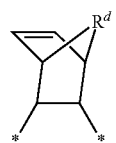
[Chemical Formula 2-5]

In the above Chemical Formula 2-5, $R^d$ is O, S, NH, substituted or unsubstituted C1 to C20 alkylene, C1 to C20 alkylamine, or C2 to C20 allylamine.

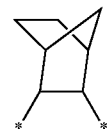
[Chemical Formula 2-6]

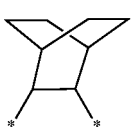
[Chemical Formula 2-7]

The binder resin may be for example prepared by mixing at least two of a fluorene-containing compound such as 9,9-bis(4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent compound such as propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like.

The black photosensitive resin composition may include the binder resin in an amount of about 1 wt % to about 30 wt %, for example about 3 wt % to about 20 wt %, based on the total amount (total weight, 100 wt %) of the black photosensitive resin composition. In some embodiments, the black photosensitive resin composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, excellent sensitivity, developability and/or close contacting (adhesive) properties may be obtained.

(C) Photopolymerizable Compound

The black photosensitive resin composition according to one embodiment may further include a photopolymerizable compound.

The photopolymerizable compound may be any monomer and/or oligomer generally used in a black photosensitive resin composition. The photopolymerizable compound may be a mono-functional and/or multi-functional ester of (meth)acrylic acid including at least one ethylenic unsaturated double bond.

The photopolymerizable compound has the ethylenic unsaturated double bond and thus, may cause sufficient polymerization during exposure in a pattern-forming process and form a pattern having excellent heat resistance, light resistance, and/or chemical resistance.

Examples of the photopolymerizable compound may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether(meth)acrylate, trimethylol propane tri(meth)acrylate, tris(meth)acryloyloxyethyl phosphate, novolacepoxy(meth)acrylate, and the like, and combinations thereof.

Commercially available examples of the photopolymerizable compound are as follows. Examples of the mono-functional (meth)acrylic acid ester may include without limitation Aronix M-101®, M-111®, and/or M-114® (TOAGOSEI CHEMICAL INDUSTRY Co., Ltd.); KAYARAD TC-110S® and/or TC-120S® (NIPPON KAYAKU Co., Ltd.); V-158® and/or V-2311® (OSAKA ORGANIC CHEMICAL Ind., Ltd.), and the like. Examples of a difunctional (meth)acrylic acid ester may include without limitation Aronix M-210®, M-240®, and/or M-6200® (TOAGOSEI CHEMICAL INDUSTRY Co., Ltd.), KAYARAD HDDA®, HX-220®, and/or R-604® (NIPPON KAYAKU Co., Ltd.), V-260®, V-312®, and/or V-335 HP® (OSAKA ORGANIC CHEMICAL Ind., Ltd.), and the like. Examples of a trifunctional (meth)acrylic acid ester may include without limitation Aronix M-309®, M-400®, M-405®, M-450®, M-7100®, M-8030®, and/or M-8060® (TOAGOSEI CHEMICAL INDUSTRY Co., Ltd.), KAYARAD TMPTA®, DPCA-20®, DPCA-30®, DPCA-60®, and/or DPCA-120® (NIPPON KAYAKU Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The photopolymerizable compound may be treated with acid anhydride to improve developability.

The black photosensitive resin composition may include the photopolymerizable compound in an amount of about 1 wt % to about 20 wt %, for example about 1 wt % to about 10 wt %, based on the total amount (total weight, 100 wt %) of the black photosensitive resin composition. In some embodiments, the black photosensitive resin composition may include the photopolymerizable compound in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable compound can be in a range from about any of the foregoing amounts to about any other of the foregoing amounts.

When the photopolymerizable compound is included in an amount within the above range, the reactive unsaturated compound can be sufficiently cured during exposure in a pattern-forming process and can have excellent reliability and thus, may form a pattern that can have excellent heat resistance, light resistance, and/or chemical resistance and also, excellent resolution and/or close contacting property.

(D) Photopolymerization Initiator

The photopolymerization initiator may be any photopolymerization initiator generally used in a black photosensitive resin composition. Examples of the photopolymerization initiator may include without limitation acetophenone-based compounds, benzophenone-based compounds, thioxanthone-based compounds, benzoin-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1,2-octandione, 2-dimethylamino-2-(4-methylbenzyl)-1-(4-morpholin-4-yl-phenyl)butan-1-one, 1-(4-phenylsulfanyl phenyl)butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-one oxime-O-acetate, 1-(4-phenylsulfanyl phenyl)-butan-1-one oxime-O-acetate, and the like, and combinations thereof.

The photopolymerization initiator may further include one or more of a carbazole-based compound, a diketone-based compound, a sulfonium borate-based compound, a diazo-based compound, an imidazole-based compound, a biimidazole-based compound, and the like in addition to or instead of the foregoing compounds.

The photopolymerization initiator may be used with a photosensitizer capable of causing a chemical reaction by absorbing light and becoming excited and then, transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The black photosensitive resin composition may include the photopolymerization initiator in an amount of about 0.05 wt % to about 5 wt %, for example about 0.1 wt % to about 5 wt %, based on the total amount (total weight, 100 wt %) of the black photosensitive resin composition. In some embodiments, the black positive photosensitive resin composition may include the photopolymerization initiator in an amount of about 0.05, 0.06, 0.07, 0.08, 0.09, 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, excellent reliability may be secured due to sufficiently curing during exposure in a pattern-forming process, a pattern may have excellent resolution and close contacting property as well as excellent heat resistance, light resistance, and/or chemical resistance, and transmittance may be prevented from deterioration due to a non-reaction initiator.

(E) Solvent

The solvent is a material having compatibility with the binder resin, the pigment, the photopolymerizable compound, and the photopolymerization initiator but not reacting therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. Additionally, high boiling point solvents such as but not limited to N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used. The solvents may be used singularly or as a mixture of two or more.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like may be used.

The black photosensitive resin composition may include the solvent in a balance amount, for example about 40 wt % to about 90 wt % based on the total amount (total weight, 100 wt %) of the black photosensitive resin composition. In some embodiments, the black photosensitive resin composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the black photosensitive resin composition may have an appropriate viscosity which can improve coating characteristics of a light blocking layer.

(F) Other Additive(s)

The black photosensitive resin composition may further include one or more other additives. Examples of the additives include without limitation malonic acid; 3-amino-1,2-propanediol; silane-based coupling agents having a vinyl group or a (meth)acryloxy group; leveling agents; fluorine-based surfactants; radical polymerization initiators; and the like, and combinations thereof.

In addition, the black photosensitive resin composition may further include a silane coupling agent having a reactive substituent such as a carboxyl group, a methacryloyl group, an isocyanate group, an epoxy group, and the like to improve its adherence to a substrate.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like, and these may be used singularly or in a mixture of two or more.

The silane-coupling agent may be included in an amount of about 0.01 to about 10 parts by weight based on about 100 parts by weight of the black photosensitive resin composition. When the silane-coupling agent is included in an amount within the above range, close contacting property, storing property, and the like may be excellent.

In addition, the black photosensitive resin composition may further include a surfactant, for example a fluorine-based surfactant to improve coating and prevent a defect if necessary.

Examples of the fluorine-based surfactant may include without limitation commercial fluorine-based surfactants such as BM-1000® and/or BM-1100® (BM Chemie Inc.); MEGAFACE F 142D®, F 172®, F 173®, and/or F 183® (Dainippon Ink Kagaku Kogyo Co., Ltd.); FULORAD FC-135®, FULORAD FC-170C®, FULORAD FC-430®, and/or FULORAD FC-431® (Sumitomo 3M Co., Ltd.); SURFLON S-112®, SURFLON S-113®, SURFLON S-131®, SURFLON S-141®, and/or SURFLON S-145® (Asahi Glass Co., Ltd.); SH-28PA®, SH-190®, SH-193®, SZ-6032®, and/or SF-8428® (Toray Silicone Co., Ltd.), and the like, and combinations thereof.

The surfactant may be used in an amount of about 0.001 to about 5 parts by weight based on about 100 parts by weight of the black photosensitive resin composition. When the surfactant is included in an amount within the above range, excellent wetting on a glass substrate as well as coating uniformity may be secured, but a stain may not be produced.

The black photosensitive resin composition may further include an epoxy compound to improve close contacting property with a substrate and the like.

Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

The epoxy compound may be included in an amount of about 0.01 to about 20 parts by weight, for example, about 0.1 to about 10 parts by weight, based on about 100 parts by weight of the black photosensitive resin composition. When the epoxy compound is included in an amount within the above range, a close contacting property, a storage property, and the like may be improved.

Furthermore, the black photosensitive resin composition may include one or more other additives such as but not limited to an antioxidant, a stabilizer, and the like in a predetermined amount unless they deteriorate properties of the photosensitive resin composition.

According to another embodiment of the present invention, a light blocking layer manufactured using the black photosensitive resin composition is provided. The light blocking layer may be manufactured as follows.

(1) Coating and Film Formation

The black photosensitive resin composition can be coated to have a desired thickness, for example, a thickness ranging from about 1.2 μm to about 2.0 μm, on a substrate which undergoes a predetermined pretreatment, using a spin or slit coating method, a roll coating method, a screen-printing method, an applicator method, and the like. Then, the coated substrate can be heated at a temperature ranging from about 70° C. to about 90° C. for about 1 minute to about 10 minutes to remove a solvent.

(2) Exposure

The resultant film can be radiated by an active ray of about 200 nm to about 500 nm after putting a mask with a predetermined shape to form a desired pattern. The radiation can be performed by using a light source such as a mercury lamp with a low pressure, a high pressure, or an ultrahigh pressure, a metal halide lamp, an argon gas laser, and the like. An X ray, an electron beam, and the like may be also used.

The exposure process can use, for example, a light dose of about 500 mJ/cm$^2$ or less (with a 365 nm sensor) when a high pressure mercury lamp is used. However, the light dose may vary depending on the kinds of each component of the black photosensitive resin composition, their combination ratio, and dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Therefore, the above black photosensitive resin composition may provide a pattern having improved high close-contacting force and/or resolution required for a light blocking layer.

In addition, another embodiment provides a color filter manufactured using the above black photosensitive resin composition.

Hereinafter, the present invention is illustrated in more detail with reference to the following examples. These examples, however, are not in any sense to be interpreted as limiting the scope of the invention.

EXAMPLE

Preparation of Black Photosensitive Resin Composition

Examples 1 to 5 and Comparative Examples 1 to 4

Each photosensitive resin composition according to Examples 1 to 5 and Comparative Examples 1 to 4, respectively, is prepared to have a composition as set forth in the following Table 1 by using the following components.

Specifically, a photopolymerization initiator is dissolved in a solvent, the solution is agitated at room temperature for about 30 minutes, a binder resin and a photopolymerizable compound are added thereto, and the mixture is agitated at room temperature for about one hour. Subsequently, a silane-based coupling agent is added to the agitated solution, the mixture is agitated for about 10 minutes, a pigment and a silica nanoparticle are respectively added thereto, and the obtained mixture is agitated at room temperature for about 2 hours. Subsequently, the product is 3 times filtered to remove impurities, obtaining a black photosensitive resin composition.

TABLE 1

(unit: wt %)

|  |  | Ex. 1 | Ex. 2 | Ex 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| (A) Binder resin | A-1 | 3.6 | 3.6 | 3.6 | 3.6 | 3.6 | 3.6 | 2.8 | 2.8 | — |
|  | A-2 | — | — | — | — | — | — | — | — | 3.6 |
| (B) Pigment |  | 17 | 17 | 17 | 17 | 17 | 17 | 17 | 19 | 17 |
| (B') Silica nanoparticle |  | 0.2 | 0.6 | 0.8 | 1.0 | 1.6 | 0.1 | 2.0 | — | — |
| (C) Photopolymerizable compound |  | 1.4 | 1.4 | 1.4 | 1.4 | 1.4 | 1.4 | 1.4 | 1.4 | 1.4 |
| (D) Photopolymerization | D-1 | 0.5 | 0.5 | 0.5 | 0.5 | 0.5 | 0.5 | 0.5 | 0.5 | 0.5 |
| initiator | D-2 | 0.1 | 0.1 | 0.1 | 0.1 | 0.1 | 0.1 | 0.1 | 0.1 | 0.1 |
| (E) Solvent | E-1 | 43 | 42.6 | 42.4 | 42.2 | 41.6 | 43.1 | 42 | 42 | 43.2 |

TABLE 1-continued (unit: wt %)

|  |  | Ex. 1 | Ex. 2 | Ex 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
|  | E-2 | 34 | 34 | 34 | 34 | 34 | 34 | 34 | 34 | 34 |
| (F) Additive |  | 0.2 | 0.2 | 0.2 | 0.2 | 0.2 | 0.2 | 0.2 | 0.2 | 0.2 |
| Sum |  | 100.0 | 100.0 | 100.0 | 100.0 | 100.0 | 100.0 | 100.0 | 100.0 | 100.0 |

(A) Binder Resin
(A-1) Cardo-based resin (V259ME, Nippon Steel Chemical Co., Ltd.)
(A-2) Acrylic-based resin (BX04, Nippon Shokubai Co., LTD.)
(B) Pigment
Mill base including carbon black (CI-M-400, SAKATA INX CORP)
(B') Silica Nanoparticle
Mill base including silica (CI-M-001, SAKATA INX CORP)
(C) Photopolymerizable compound
Dipentaerythritol hexaacrylate (Nippon Kayaku Co. Ltd.)
(D) Photopolymerization Initiator
(D-1) IRGACURE OXE02 (BASF Co. Ltd.)
(D-2) IRG369 (BASF Co. Ltd.)
(E) Solvent
(E-1) Propylene glycol methylether acetate (PGMEA)
(E-2) Diethylene glycol methylethyl ether (EDM)
(F) Additive
y-glycidoxy propyl trimethoxysilane (S-510, Chisso Corporation)

Evaluation 1: Taper Characteristics

Figure 2:
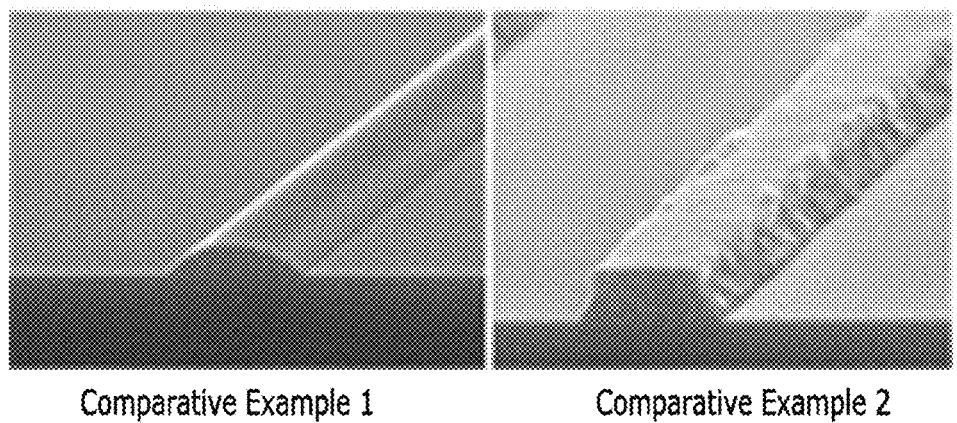
FIG. 2 includes scanning electron microscopy (SEM) photographs showing patterns obtained by curing the black photosensitive resin compositions according to Comparative Examples 1 and 2.

The black photosensitive resin compositions according to Examples 1 to 5 and Comparative Examples 1 to 4 are respectively coated to be 1.3 μm thick on 10 cm*10 cm glasses by using a spin-coater (Opticoat MS-A150, Mikasa Co., Ltd.), soft-baked on a hot-plate at 80° C. for 150 seconds, and exposed with 50 mJ by using an exposer (HB-50110AA, Ushio Inc.) and a photo mask. Subsequently, the exposed products are developed with a 0.2 wt % potassium hydroxide (KOH) aqueous solution by using a developer (SSP-200, SVS Corp.) and hard-baked in an oven at 230° C. for 30 minutes, obtained patterned glass specimens. As for the patterns of the obtained glass specimens, taper angles are measured by using scanning electron microscopy (SEM), and the results are provided in the following Table 2 and FIGS. 1 and 2.

Evaluation 2: Resolution

Figure 3:
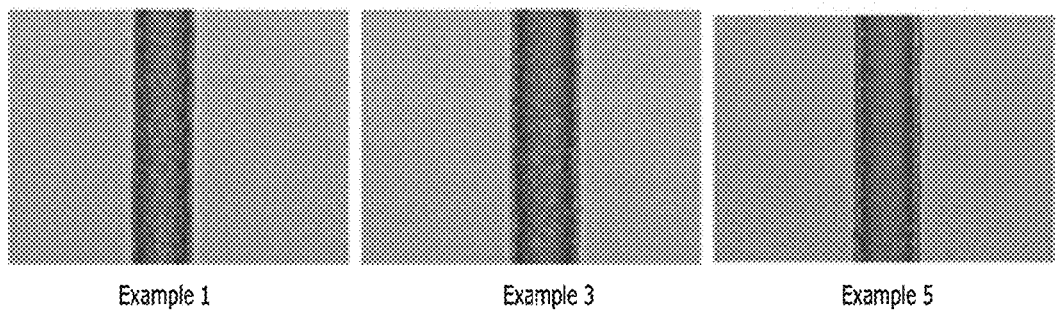
FIG. 3 includes optical microscope photographs showing line widths indicating a minimum CD (critical dimension) in the patterns obtained by curing the black photosensitive resin compositions according to Examples 1, 3, and 5.
Figure 4:
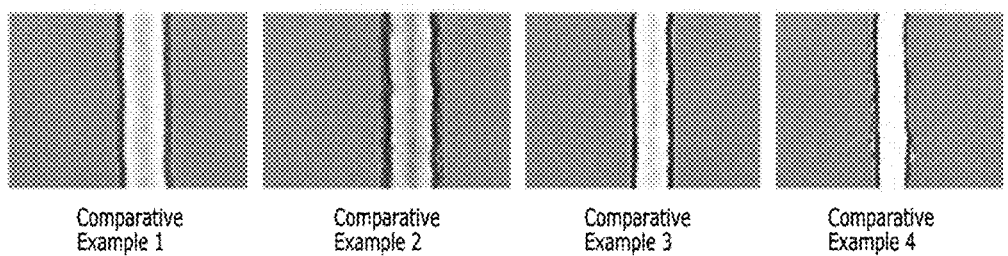
FIG. 4 includes optical microscope photographs showing line widths indicating a minimum CD (critical dimension) in the patterns obtained by curing the black photosensitive resin compositions according to Comparative Examples 1 to 4.

Samples having the most minute line width out of the glass specimen patterns are identified by measuring CDs (Critical dimensions) of the glass specimen patterns in Evaluation 1 with an optical microscope and the results are provided in the following Table 2 and FIGS. 3 and 4.

Evaluation 3: Linearity

Patterns having a line width of 20 μm out of the glass specimen patterns in Evaluation 1 are identified by using an optical microscope and the results are provided in the following Table 2 and FIGS. 3 and 4. Linearity of the patterns is evaluated by examining a smoothness degree on the edge of the patterns with naked eyes and judging them into 'very good,' 'good,' or 'deficient.'

TABLE 2

|  | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|
| Taper (°) | 35 | 38 | 42 | 45 | 50 | 28 | 60 | 35 | 35 |
| Resolution (μm) | 6 | 5 | 5 | 5 | 5 | 6 | 6 | 10 | 16 |
| Linearity | very good | very good | very good | very good | good | good | deficient | deficient | deficient |

Referring to Table 2 and FIGS. 1 to 4, the black photosensitive resin compositions according to Examples 1 to 5 have excellent resolution along with excellent taper characteristics and also excellent linearity compared with the photosensitive resin compositions according to Comparative Examples 1 to 4.

Specifically, referring to Table 2 and FIGS. 1 to 4, the black photosensitive resin compositions including 1 to 11 parts by weight of a silica nanoparticle based on a pigment according to Examples 1 to 5 exhibit excellent taper characteristics compared with the photosensitive resin composition including less than 1 part by weight of a silica nanoparticle according to Comparative Example 1 and excellent linearity compared with the photosensitive resin composition including greater than 11 parts by weight of a silica nanoparticle according to Comparative Example 2. In addition, the photosensitive resin composition including a cardo-based binder resin, no silica nanoparticle but more pigment according to Comparative Example 3 exhibits better resolution compared with the photosensitive resin composition including an acrylic-based binder resin instead of the cardo-based binder resin, no silica nanoparticle and a pigment according to Comparative Example 4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A black photosensitive resin composition, comprising:
   (A) a cardo-based binder resin;
   (B) a colorant including a pigment and a silica nanoparticle, wherein the silica nanoparticle has an average particle diameter of about 10 nm to about 50 nm;
   (C) a photopolymerizable compound;
   (D) a photopolymerization initiator; and
   (E) a solvent,
   wherein the silica nanoparticle is included in an amount of about 1 part by weight to about 9 parts by weight based on about 100 parts by weight of the pigment, and
   wherein the black photosensitive resin composition has a taper angle of about 35° to 45°.

2. The black photosensitive resin composition of claim 1, wherein the silica nanoparticle is included in an amount of about 1 part by weight to about 5 parts by weight based on about 100 parts by weight of the pigment.

3. The black photosensitive resin composition of claim 1, wherein the silica nanoparticle has an average particle diameter of about 10 nm to about 20 nm.

4. The black photosensitive resin composition of claim 1, wherein the pigment included in the colorant is a black pigment.

5. The black photosensitive resin composition of claim 4, wherein the black pigment is carbon black.

6. The black photosensitive resin composition of claim 1, wherein the black photosensitive resin composition comprises:
   about 1 wt % to about 30 wt % of the binder resin (A);
   about 1 wt % to about 30 wt % of the colorant (B) including silica nanoparticle and pigment;
   about 1 wt % to about 20 wt % of the photopolymerizable compound (C);
   about 0.05 wt % to about 5 wt % of the photopolymerization initiator (D); and
   a balance amount of the solvent (E).

7. The black photosensitive resin composition of claim 1, wherein the black photosensitive resin composition further comprises an additive selected from malonic acid; 3-amino-1,2-propanediol; a silane-based coupling agent having a vinyl group or a (meth)acryloxy group; a leveling agent; a fluorine-based surfactant; a radical polymerization initiator; or a combination thereof.

8. A light blocking layer manufactured using the photosensitive resin composition of claim 1.

9. A color filter comprising the light blocking layer of claim 8.

10. The black photosensitive resin composition of claim 1, wherein the cardo-based resin (A) includes a resin represented by the following Chemical Formula 1:

wherein, $R^1$ and $R^2$ are the same or different and are each independently hydrogen or a substituted or unsubstituted (meth)acryloyloxy alkyl group, $R^3$ and $R^4$ are the same or different and are each independently hydrogen, halogen, or substituted or unsubstituted C1 to C20 alkyl, each $Z^1$ is independently a single bond, O, CO, $SO_2$, $CR^7R^8$, $SiR^9R^{10}$, wherein $R^7$ to $R^{10}$ are the same or different and are each independently hydrogen or substituted or unsubstituted C1 to C20 alkyl, or one of linking groups represented by the following Chemical Formulae 1-1 to 1-11,

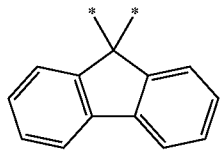

[Chemical Formula 1-1]

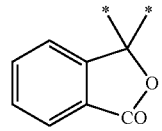

[Chemical Formula 1-2]

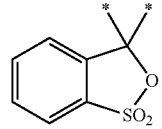

[Chemical Formula 1-3]

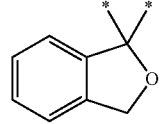

[Chemical Formula 1-4]

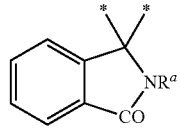

[Chemical Formula 1-5]

wherein in the above Chemical Formula 1-5, $R^a$ is hydrogen, ethyl, $C_2H_4Cl$, $C_2H_4OH$, $CH_2CH=CH_2$, or phenyl,

[Chemical Formula 1]

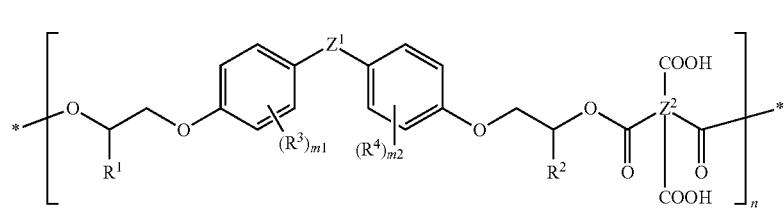

[Chemical Formula 1-6]

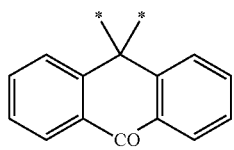

[Chemical Formula 1-7]

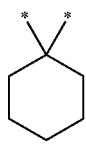

[Chemical Formula 1-8]

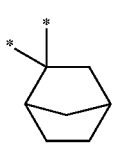

[Chemical Formula 1-9]

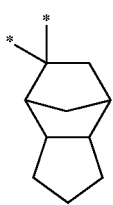

[Chemical Formula 1-10]

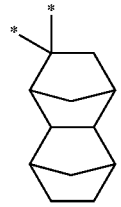

[Chemical Formula 1-11]

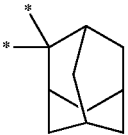

each $Z^2$ is independently an acid anhydride residual group or an acid dianhydride residual group, m1 and m2 are the same or different and are each independently integers ranging from 0 to 4, and n is an integer ranging from 1 to 30.

11. The black photosensitive resin composition of claim 10, each $Z^1$ is independently one of linking groups represented by Chemical Formulae 1-1 to 1-11.

12. The black photosensitive resin composition of claim 1, wherein the silica nanoparticle is included in an amount of about 1 part by weight to about 7 parts by weight based on about 100 parts by weight of the pigment.

13. The black photosensitive resin composition of claim 1, wherein the silica nanoparticle is included in an amount of about 1 part by weight to about 5 parts by weight based on about 100 parts by weight of the pigment.

* * * * *